US006806519B2

(12) United States Patent
Chu et al.

(10) Patent No.: US 6,806,519 B2
(45) Date of Patent: Oct. 19, 2004

(54) SURFACE MOUNTABLE DEVICE

(75) Inventors: Edward Fu-Hua Chu, Taipei (TW); David Shau-Chew Wang, Taipei (TW); Yun-Ching Ma, Pingtung (TW)

(73) Assignee: Polytronics Technology Corporation, Hsinchu (TW)

( * ) Notice: Subject to any disclaimer, the term of this patent is extended or adjusted under 35 U.S.C. 154(b) by 0 days.

(21) Appl. No.: 10/265,540

(22) Filed: Oct. 7, 2002

(65) Prior Publication Data

US 2003/0067054 A1 Apr. 10, 2003

(30) Foreign Application Priority Data

Oct. 8, 2001 (TW) ........................................ 090217114

(51) Int. Cl.[7] ............................................ H01L 21/8242
(52) U.S. Cl. .......................... 257/234; 257/232; 438/48
(58) Field of Search ................................ 257/266–234, 257/470; 438/48

(56) References Cited

U.S. PATENT DOCUMENTS 3,219,480 A * 11/1965 Girard ..................... 427/126.3
4,882,466 A * 11/1989 Friel .......................... 219/219
5,331,390 A * 7/1994 Kimura et al. .............. 399/227

* cited by examiner

*Primary Examiner*—Dung A. Le
(74) *Attorney, Agent, or Firm*—Seyfarth Shaw LLP

(57) ABSTRACT

The present invention discloses a surface mountable device comprising a current-sensitive element and two electrodes. The current-sensitive element is composed of a PTC conductive composite, comprising at least one polymer and a conductive filler. The feature of the present invention is that the current-sensitive element is a three-dimensional bent structure so that the shape, length and height of the device can be varied according to the space of the circuit board and the resistance of the surface mountable device. Therefore, the mountable surface of the circuit board can be used more efficiently. Moreover, the area of the current-sensitive element of the present invention is larger than that of the conventional surface mountable device. Consequently, the normal resistance of the surface mountable device of the present invention is smaller than that of the conventional surface mountable device and the voltage endurance of the surface mountable device of the present invention is increased.

12 Claims, 2 Drawing Sheets

SURFACE MOUNTABLE DEVICE

BACKGROUND OF THE INVENTION

1. Field of the Invention

The present invention relates to a surface mountable device, and more particularly, to a surface mountable device with a three-dimensional structure.

2. Description of Related Art

FIG. 1 depicts a conventional surface mountable device 10, comprising an upper electrode 11, a lower electrode 12 and a current-sensitive element 13. Nowadays, the current-sensitive element 13 is usually formed of a conductive material having Positive Temperature Coefficient (PTC). The resistance of the PTC conductive material can be kept extremely low at normal operation due to its low sensitivity to temperature variance so that the circuit can operate normally. However, if the over-current or over-temperature effect occurs, the resistance will immediately be increased thousands of times to a higher resistance state (e.g. above $10^4$ ohm.) Therefore, the over current will be reversely eliminated and the objective to protect the circuit device can be achieved.

Generally, the normal resistance value of the current-sensitive element 13 by follows the conventional formula:

$$R = \frac{\rho \times l}{A},$$

in which ρ is the conductive coefficient of the PTC conductive composition, l is the length and A is the area of the current-sensitive element 13. Since the size of the printed circuit board of the portable electronic product decreases more and more the footprint of the surface mountable device mounted on the circuit board also needs to be reduced comparatively. Thus, according to the above formula, the normal resistance of the surface mountable device will be increased.

In addition, since the conventional surface mountable device is a planar structure, it will occupy a lot of surface area of the circuit board when the convention surface mountable device is mounted. To solve this space limitation problem, Raychem Corp. discloses a vertical surface mountable device 20 (Model TS250), comprising a conventional surface mountable device 10, a covering 25, an insulating material 24, a first conductive element 26 and a second conductive element 27, as shown in FIG. 2. The covering 25 is used to cover the conventional surface mountable device 10 in which the surface mountable device 10 is vertically placed in the covering 25. The first conductive element 26 and the second conductive element 27 are disposed on the bottom surface of the vertical surface mountable device 20 and contacts the first electrode 11 and the second electrode 12 of the conventional surface mountable device 10 respectively to be mounted on the circuit board (not shown.) Further, more an insulating material 24 is filled into the vacant space between the covering 25 and the two electrodes 11, 12. Although the mounted footprint on the surface mountable device 20 by the surface mountable device can be reduced by the above structure, the current leakage occurs more easily because the first conductive element 26 and the second conductive element 27 are disposed too closely. Because the structure is covered with the covering 25, filling the insulating material 24 is difficult and dissipating the heat is also difficult. Moreover, the voltage endurance of the above structure has an upper limit (about 60V) which is not suitable for the products requiring high voltage endurance.

SUMMARY OF THE INVENTION

A major objective of the present invention is to provide a surface mountable device, wherein the shape of the device can be varied according to the available space of the circuit board so that the requirement of a light, thin and small circuit board can be met.

A second objective of the present invention is to provide a surface mountable device, wherein the shape of the device is a three-dimensional structure, different from the two-dimensional planar structure of the conventional surface mountable device, so as to increase the area of the PTC conductive material and reduce the normal resistance and increase the voltage endurance up to above 200V. In other words, the surface mountable device of the present invention can be applied to products requiring high voltage endurance.

A third objective of the present invention is to provide a surface mountable device, wherein the mounted direction can be varied according to the requirement. Thus, the surface space of the circuit board can be used more efficiently.

A fourth objective of the present invention is to provide a surface mountable device, which can be directly mounted onto the circuit board and be easily filled with insulating material; therefore short circuit will not occur and the heat inside the device is dissipated easily.

In order to achieve the above objectives and to avoid the disadvantages of the prior art, the present invention discloses a surface mountable device comprising a current-sensitive element and two electrodes in which the current-sensitive element is composed of a PTC conductive composite material having a positive temperature coefficient, comprising at least one polymer and a conductive filler. The present invention is characterized in that the current-sensitive element is a three-dimensional bent structure so that the shape, length and height of the element can be varied according to the requirement of mounting space and resistance and thus the surface space of the circuit board can be used more efficiently. Moreover, the area of the current-sensitive element of the present invention is larger than that of the conventional surface mountable device. Consequently, the normal resistance of the surface mountable device of the present invention is smaller than that of the conventional surface mountable device and the voltage endurance of the surface mountable device of the present invention is increased accordingly.

The foregoing and other objectives and advantages of the invention, as well as the manner in which the same are accomplished, will become clearer based on the following detailed description taken in conjunction with the accompanying drawings.

DETAILED DESCRIPTION OF THE INVENTION

Figure 1:
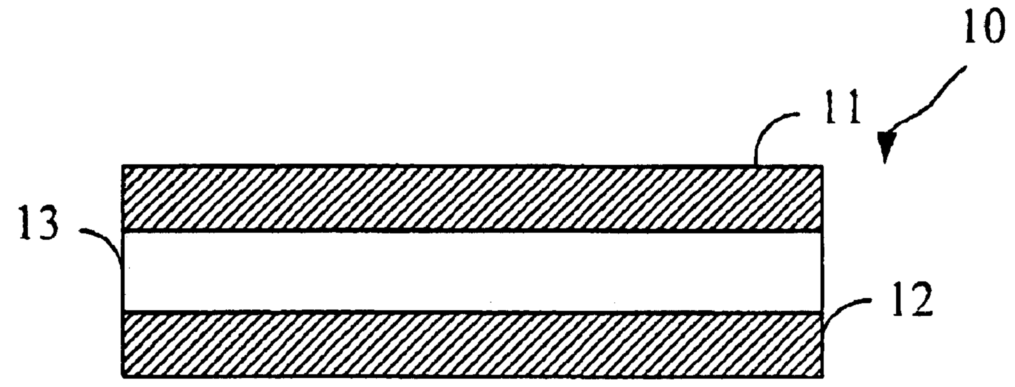
FIG. 1 Prior Art
FIG. 1 is a cross-sectional view of a conventional surface mountable device.
Figure 2:
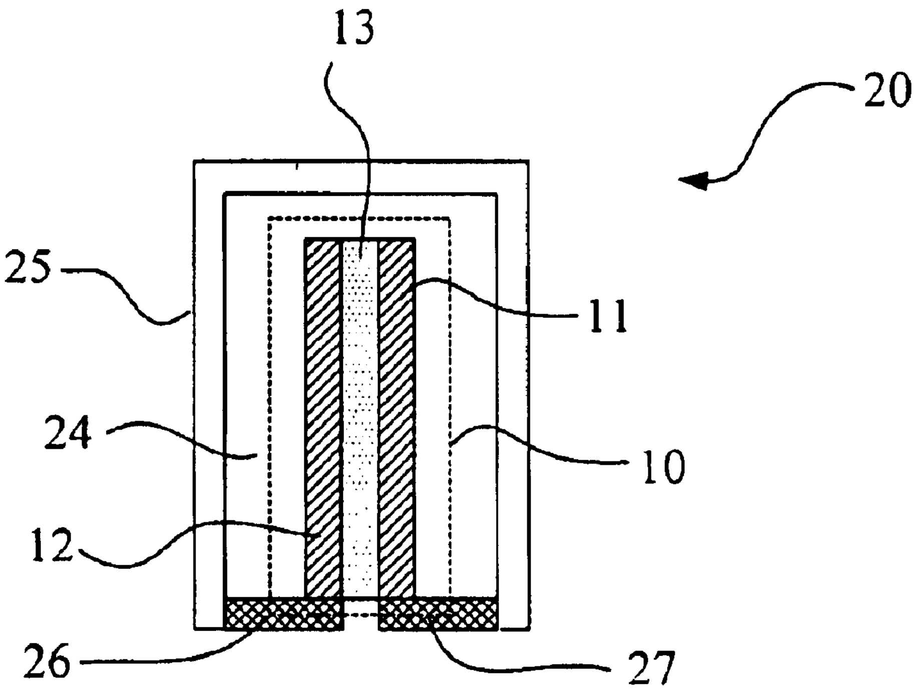
FIG. 2 Prior Art
FIG. 2 is a cross-sectional view of another conventional surface mountable device.
Figure 3:
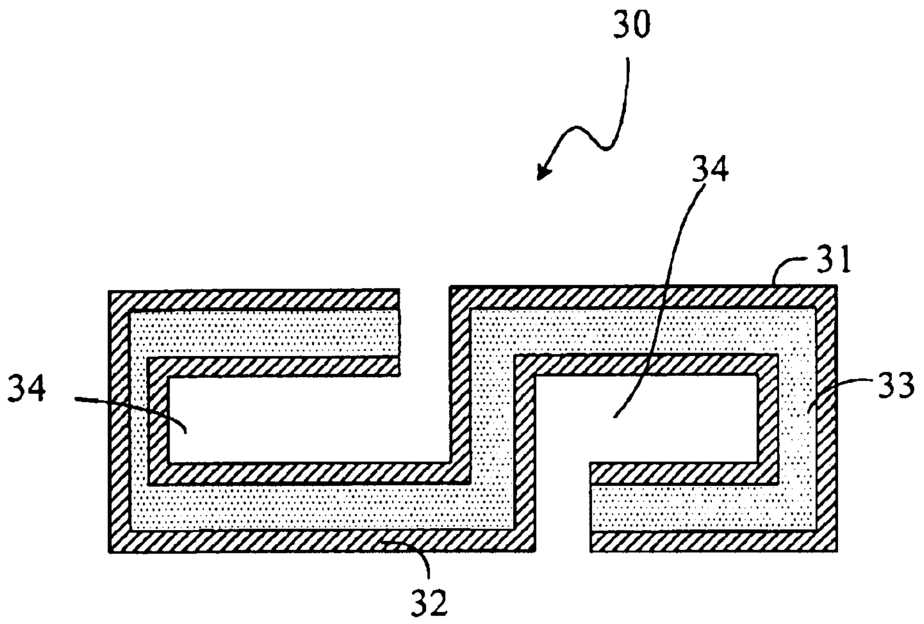
FIG. 3 is a cross-sectional view of a surface mountable device according to a first embodiment of the present invention.

FIG. 3 is a cross-sectional view of a surface mountable device according to a first embodiment of the present invention. The surface mountable device 30 is S-shaped and comprises a first electrode 31, a second electrode 32 and a current-sensitive element 33. The current-sensitive element 33 is composed of a PTC conductive material where the conductive material comprises a polymer and conductive filler. The polymer is a crystalline polymer which is selected from the group consisting of polyethylene, polypropylene, polyoctylene and the mixture thereof. The conductive filler is uniformly dispersed in the polymer and is selected from the group consisting of conductive carbon black, metal powder, carbonized ceramic powder and the mixture thereof. To improve the sensitivity and the physical property, the current-sensitive element 33 further comprises an additive such as a photo initiator, a cross-linking agent, a coupling agent, a dispersing agent, a stabilizer, an anti-oxidizing agent a non-conductive filler, etc. Moreover, the current-sensitive element 33 can be shaped by injection molding, thermal forming, press molding, or continuous press/cutting operation. After formation, the current-sensitive element 33 has a first surface and a second surface extended from the both sides.

The first electrode 31 and the second electrode 32 are formed on the first and second surface of the current-sensitive element 33 using lamination, calendering, sputtering, chemical vapor deposition (CVD), electroplating and non-electrolysis plating methods. The first electrode 31 and the second electrode 32 are conductive metal materials, which are selected from the group consisting of copper, gold, nickel, aluminum and the alloy thereof. To improve the space efficiency of the circuit board, the present invention does not limit the adhering direction of the surface mountable device 30 on the circuit board.

In addition, an insulating material 34 is filled into the S-shaped curved clearance so as to avoid current leakage within the surface mountable device 30; or, after mounting onto the circuit board, the surface mountable device 30 can be covered with insulating material to protect it from damages by external factors.

Moreover, the length and the height of the surface mountable device 30 can be increased according to the requirement so that the area of the current-sensitive element 33 can be increased and the objective for reducing the resistance of the surface mountable device 30 can be achieved.

Figure 4:
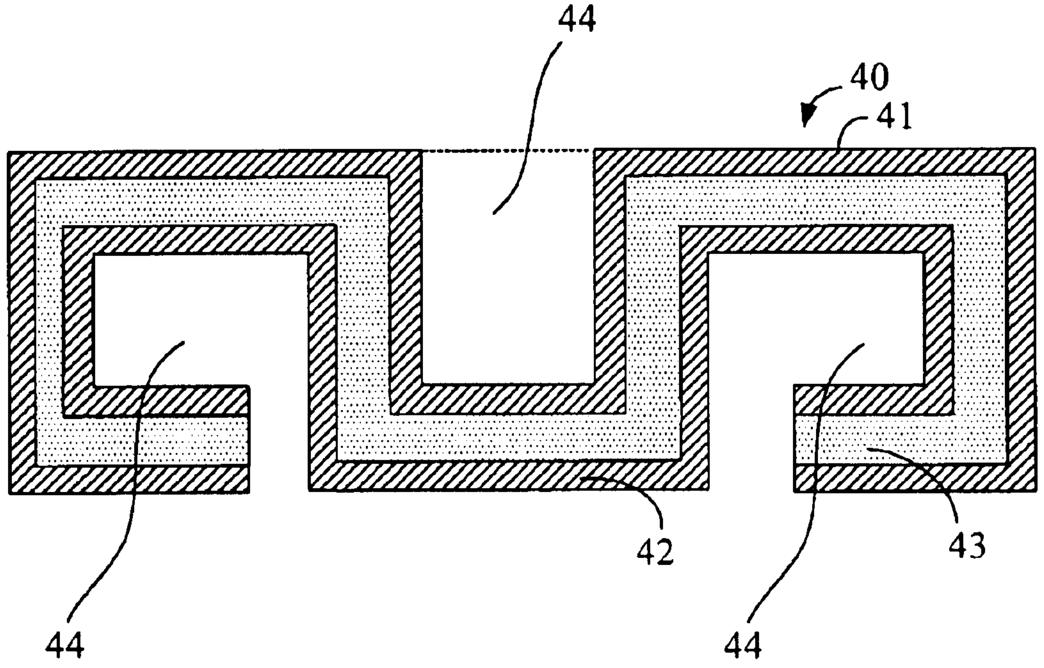
FIG. 4 is a cross-sectional view of a surface mountable device according to a second embodiment of the present invention.

FIG. 4 is a cross-sectional view of a surface mountable device according to a second embodiment of the present invention. In the embodiment, the surface mountable device 40 is bow-shaped, comprising a first electrode 41, a second electrode 42, a current-sensitive element 43 and an insulating material 44 filled in the area enclosed by the current-sensitive element 43. Since the area of the current-sensitive element 43 is larger than that of the first embodiment, the normal resistance of the surface mountable device 40 is smaller.

The technical contents and features of this invention have been sufficiently described in the above descriptions. It should be understood that any modifications or changes without departing from the spirits of the invention are intended to be covered in the protection scope of the invention.

What is claimed is:

1. A surface mountable device comprising:

a current-sensitive element having a sinuous shape for reducing normal resistance;

a first electrode connected to one surface of said current-sensitive element; and a second electrode connected to another surface of said current-sensitive element.

2. The surface mountable device of claim 1, wherein said first electrode and said second electrode are made of conductive material.

3. The surface mountable device of claim 2, wherein said conductive material is selected from the group consisting essentially of copper, gold, nickel and alloy thereof.

4. The surface mountable device of claim 1, wherein said current-sensitive element is composed of a conductive composite material exhibiting a positive temperature coefficient behavior.

5. The surface mountable device of claim 4, wherein said conductive composite material comprises:

a crystalline polymer; and a conductive filler dispersed in said crystalline polymer.

6. The surface mountable device of claim 5, wherein said crystalline polymer is selected from the group consisting essentially of polyethylene, polypropylene, polyoctylene, polyvinylidene fluoride, polytetrafluoroethylene, and the mixture thereof.

7. The surface mountable device of claim 5, wherein said conductive filler is selected from the group consisting essentially of carbon black, metal power, carbonized ceramic powder and the mixture thereof.

8. The surface mountable device of claim 5, wherein said conductive composite material further comprises a photo initiator, a cross-linking agent, a coupling agent, a dispersing agent, a stabilizer, a flame retardant, a plasticizing agent, an anti-oxidizing agent and a non-conductive filler to improve its sensitivity and physical property.

9. The surface mountable device of claim 1, wherein said current-sensitive element is S-shaped.

10. The surface mountable device of claim 1, wherein said current-sensitive element is bow-shaped.

11. The surface mountable device of claim 1, wherein vacant spaces enclosed by said current-sensitive element are filled by an insulating material to avoid a current leakage.

12. The surface mountable device of claim 1, wherein the first and second electrodes follow the sinuous shape of the current-sensitive element.

* * * * *